United States Patent [19]
Haase et al.

[11] Patent Number: 5,834,330
[45] Date of Patent: Nov. 10, 1998

[54] SELECTIVE ETCH METHOD FOR II-VI SEMICONDUCTORS

[75] Inventors: Michael A. Haase, Woodbury; Paul F. Baude; Thomas J. Miller, both of Minneapolis, all of Minn.

[73] Assignee: Minnesota Mining and Manufacturing Company, St. Paul, Minn.

[21] Appl. No.: 726,731

[22] Filed: Oct. 7, 1996

[51] Int. Cl.[6] .................................................. H01L 21/00
[52] U.S. Cl. .................................................. 438/40; 438/41
[58] Field of Search ........................................ 438/39–41

[56] References Cited

U.S. PATENT DOCUMENTS

| | | | |
|---|---|---|---|
| 5,213,998 | 5/1993 | Qiu et al. | 437/185 |
| 5,248,631 | 9/1993 | Park et al. | 437/105 |
| 5,274,269 | 12/1993 | DePuydt et al. | 257/744 |
| 5,291,507 | 3/1994 | Haase et al. | 372/44 |
| 5,319,219 | 6/1994 | Cheng et al. | 257/14 |
| 5,363,395 | 11/1994 | Gaines et al. | 372/45 |
| 5,395,791 | 3/1995 | Cheng et al. | 437/105 |
| 5,396,103 | 3/1995 | Qiu et al. | 257/744 |
| 5,404,027 | 4/1995 | Haase et al. | 257/13 |
| 5,420,446 | 5/1995 | Narui et al. | 257/103 |
| 5,423,943 | 6/1995 | Narui et al. | 156/643.1 |
| 5,488,233 | 1/1996 | Ishikawa et al. | 372/45 |
| 5,513,199 | 4/1996 | Haase et al. | 372/44 |
| 5,515,393 | 5/1996 | Okuyama et al. | 372/45 |
| 5,538,918 | 7/1996 | Haase et al. | 437/127 |
| 5,619,520 | 4/1997 | Sasai | 372/46 |

FOREIGN PATENT DOCUMENTS

| | | |
|---|---|---|
| 0 619 602 A | 10/1994 | European Pat. Off. |
| 06342960A | 12/1994 | Japan . |
| 08122701A | 5/1996 | Japan . |
| 09139549A | 5/1997 | Japan . |

OTHER PUBLICATIONS

M.A. Haase, et al; *Low–Threshold Buried–Ridge II–VI Laser Diodes* Applied Physics Letters, vol. 62, No.17, Oct. 25, 1993, pp. 2315–2317 XP000408794.

M. Shiraishi, et al, *Defect Studies in ZnSSe and ZnMgSSe by chemical etching and transmission electron spectroscopy*, Physica Status Solidi A, vol. 152, No.2, Dec. 16, 1995, Germany, pp. 377–383, XP002054832.

*Primary Examiner*—Brian Dutton
*Attorney, Agent, or Firm*—Judson K. Champlin; Lorraine R. Sherman; Philip Y. Dahl

[57] ABSTRACT

A II–VI semiconductor device is fabricated using a selective etchant in the form of aqueous solution of HX where X is Cl or Br. The II–VI semiconductor device is composed of a number of layers. Selective etching can be enabled by introducing Mg into one of the semiconductor layers. The resultant device may include a semiconductor layer containing Mg.

115 Claims, 4 Drawing Sheets

SELECTIVE ETCH METHOD FOR II-VI SEMICONDUCTORS

GOVERNMENT RIGHTS

The United States government has certain rights in this invention pursuant to Contract No. DAAH04-94-C0049 awarded by the Defense Advanced Research Projects Agency and the Department of the Army/Army Research Office.

TECHNICAL FIELD

The present invention relates generally to II–VI semiconductor devices. In particular, the present invention is a method of selectively etching a magnesium-containing semiconductor layer.

BACKGROUND OF THE INVENTION

Buried ridge (buried heterostructure) semiconductor devices are known. Such devices are useful in constructing light emitting or detecting devices, diodes and laser diodes such as those described in U.S. Pat. No. 5,213,998, issued May 25, 1993; U.S. Pat. No. 5,248,631, issued Sep. 28, 1993; U.S. Pat. No. 5,274,269, issued Dec. 28, 1993; U.S. Pat. No. 5,291,507, issued Mar. 1, 1994; U.S. Pat. No. 5,319,219, issued Jun. 7, 1994; U.S. Pat. No. 5,395,791, issued Mar. 7, 1995; U.S. Pat. No. 5,396,103, issued Mar. 7, 1995; U.S. Pat. No. 5,404,027, issued Apr. 4, 1995; U.S. Pat. No. 5,363,395, issued Nov. 8, 1994; U.S. Pat. No. 5,515,393, issued May 7, 1996; U.S. Pat. No. 5,420,446, issued May 30, 1995; U.S. Pat. No. 5,423,943, issued Jun. 13, 1995; U.S. Pat. No. 5,538,918, issued Jul. 23, 1996; and U.S. Pat. No. 5,513,199, issued Apr. 30, 1996.

Various techniques have been used in the manufacturing of such devices. One such technique is a dry etch process using Xe ion beam etching to provide the desired surface features. In ion beam etching, a mask layer covers a portion of the semiconductor. The ion beam is used to sputter off the exposed portions of the semiconductor. The portions of the semiconductor that are covered by the mask are not etched. Following the ion etch, the mask is removed, thereby exposing the underlying, unetched material. Overall, ion milling solves anisotropy and resolution limits of wet and dry chemical etch approaches, and can be well controlled with respect to major variables that affect etch performance, such as etch rate and end-point detection. In U.S. Pat. Nos. 5,420,446 and 5,423,943, F. Naria and M. Ozawa teach the use of reactive ion etching (RIE) to achieve selective etching of II–VI layers. In this technique it is found that RIE etches II–VI compounds slower if they contain Mg.

However, ion etching can damage the device. For example, the use of such ion beam etching can lead to accelerated degradation at the edges of the laser ridge. Such damage can lead to reduction in luminescence for laser diode semiconductor devices, as well as increased failure rate of such devices.

Another etching technique uses a chemical etchant which reacts with the deposited layers. Chemical etches typically cause less damage to the device than ion beam etching. However, the art has lacked a chemical etch which is compatible with, and suitable for use in II–VI semiconductor fabrication. Additionally, there is a need for a selective etch process for II–VI semiconductors.

SUMMARY OF THE INVENTION

Briefly, in one aspect of the present invention, a process for fabricating a II–VI compound semiconductor device is provided comprising the steps: (a) providing a first epitaxial layer of II–VI semiconductor on a substrate, and a second epitaxial layer of II–VI semiconductor, wherein the second layer includes magnesium (Mg) and the magnesium content of the second layer is greater than that of the first layer, (b) providing an imagewise mask of photoresist proximate to the second epitaxial layer, and (c) selectively etching the second epitaxial layer with an aqueous solution that includes HX, wherein X is either chlorine (Cl) or bromine (Br).

Furthermore, the second layer may be partially ion beam etched prior to selectively etching with HX. Advantageously, initial etching with ion beam provides for high resolution and an accelerated etch rate, while final selective etching using HX removes any damage caused by the ion beam etching. Similarly, reactive ion etching or other chemical etching may be used prior to etching with HX.

Because HX does not substantially etch the (100) surface of II–VI material that contains no Mg, over-etching and under-cutting is more controlled. Further, because of the selectivity to magnesium-containing layers, the selective etching process automatically stops (or slows significantly) at a precise depth when a magnesium-deficient layer is encountered.

One aspect of the invention includes a II–VI semiconductor device having layers containing different concentrations of Mg (including layers which contain no Mg) such that a layer of lower Mg concentration provides an etch stop layer to an HX etchant.

DETAILED DESCRIPTION OF THE PREFERRED EMBODIMENTS

A manufacturable index-guided laser is required for all blue-green laser applications in which the optical quality of the beam, or the threshold current is an important issue. The process described here enhances the manufacturability and the reliability of these devices.

The method of the invention is useful in fabricating blue-green laser diodes wherein a selective wet etching step is included. Previous work has lead to the development of a buried ridge laser diode process. That process included ion beam etching using Xe ions. The ion beam may damage the device and may lead to accelerated degradation at the edges of the laser ridge. The present invention is directed toward a wet etching step that removes damaged portions of the layer. The process uses an aqueous HX solution as an etchant where X is Cl or Br. In addition, this process has an advantage in that it selectively etches MgZnSSe cladding layers, and does not etch the underlying ZnSSe guiding layer of a II–VI laser diode. Thus, the etching process automatically stops at the precise depth desired for a practical index-guided ridge laser.

The prior art includes index-guided lasers, ion beam etching, and wet chemical etching. However, it is believed that the following have not been previously reported: 1) ion beam etching may lead to accelerated device degradation; 2) HX etches MgZnSSe; 3) HX does not etch the (100) surface of ZnSe or ZnSSe; 4) previously known II–VI etchants selectively etch ZnSeTe (used for contact layers) much faster than MgZnSSe, usually damaging the ZnSeTe graded contacts, whereas HX does not; and 5) points 2, 3 and 4 can be used to efficiently fabricate blue-green laser diodes. As used herein HX is either HCl or HBr in an aqueous solution.

Figure 1:
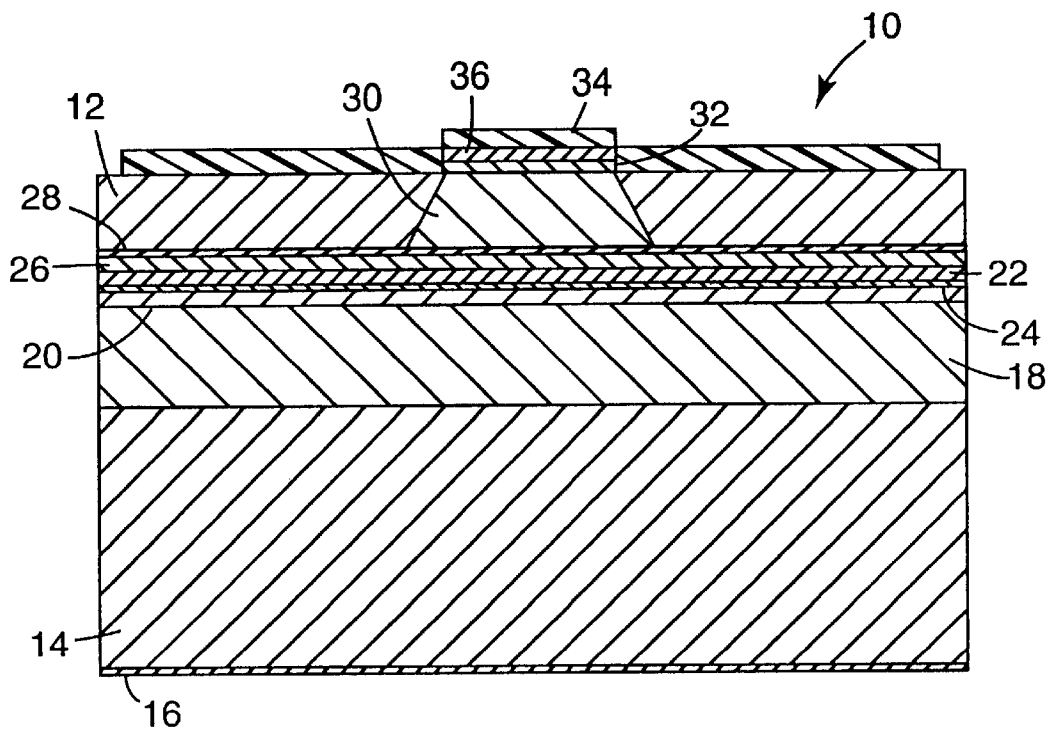
FIG. 1 is a side cross-sectional view of a substrate carrying a buried-heterostructure II–VI compound semiconductor laser diode made in accordance with the present invention.

A buried-heterostructure II–VI compound semiconductor laser diode 10 prepared in accordance with the present invention is illustrated generally in FIG. 1. As shown, laser diode 10 includes a ridge (typically 5 $\mu$m wide) having sides surrounded or "buried" by polycrystalline ZnS burying layer 12 to form a buriedridge waveguide. The various layers of device 10 may be deposited by molecular beam epitaxy (MBE) as described in U.S. Pat. Nos. 5,291,507 and 5,363,395 which is hereby incorporated by reference. In another embodiment, Be can be incorporated into the layers as described in copending application Ser. No. 08/726,618 filed Oct. 7, 1996, entitled BE-CONTAINING II–VI BLUE-GREEN LASER DIODES, filed on even date herewith.

Laser diode 10 is formed on a GaAs substrate 14 which is electrically coupled to metal contact 16. A lower MgZnSSe cladding layer 18 is deposited on GaAs substrate 14. Two ZnSSe waveguides 20 and 22 overly cladding layer 18 and are separated by a CdZnSSe quantum well 24. A first upper MgZnSSe cladding layer 26 overlies waveguide layer 22 and carries an etch stop layer 28. In one embodiment, etch stop layer 28 comprises ZnSSe. However, any appropriate II–VI material having a reduced concentration of Mg relative to cladding layer 18 may be used. Etch stop layer 28 is greater than 50 Å thick and preferably 200 Å. If layer 28 is too thick, it may affect operation of laser diode 10. A second upper cladding layer 30 overlies etch stop layer 28 and is embedded in burying layer 12. ZnSeTe ohmic contact layer 32 is formed on cladding layer 30 and is covered by metal ohmic contact electrode 36. Metal bond pad 34 covers ohmic contact electrode 36.

In one embodiment, the epitaxial layers are as follows:

| LAYER | REFERENCE # | THICKNESS |
| --- | --- | --- |
| ZnSeTe:N graded contact layer | Generally 32 | 500 Å |
| ZnSe:N contact layer | Generally 32 | 0.1 $\mu$m |
| MgZnSSe:N cladding; | 30 | 0.8 $\mu$m |
| ZnSSe:N etch stop | 28 | 200 Å |
| MgZnSSe:N cladding | 26 | 500 Å |
| ZnSSe:N guiding layer; | 22 | 0.125 $\mu$m |
| CdZnSSe quantum well | 24 | 40 Å |
| ZnSSe:Cl guiding layer; | 20 | 0.125 $\mu$m |
| MgZnSSe:Cl cladding; | 18 | 0.8 $\mu$m |
| ZnSe:Cl contact layer; | (Not shown) | 0.02 $\mu$m |
| GaAs:Si buffer layer | Generally 14 | |
| GaAs:Si substrate | Generally 14 | |

Figure 2:
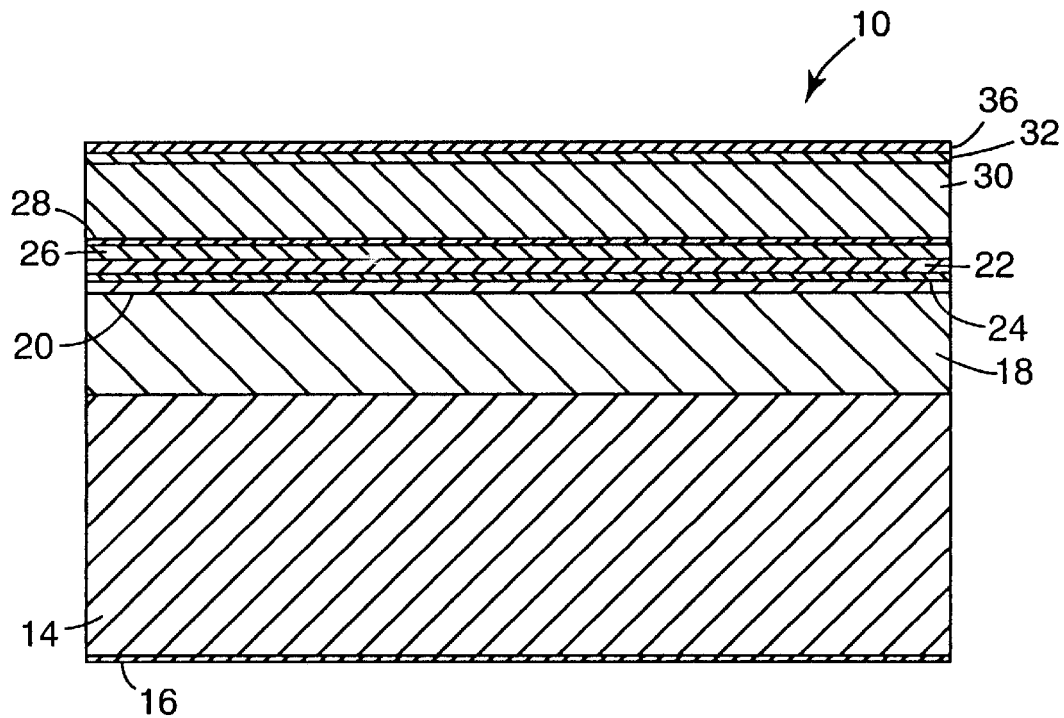
FIG. 2 is a side cross-sectional view of the substrate of FIG. 1 showing an initial processing step.

Fabrication of buried heterostructure 10 shown in FIG. 1 begins with application of the layers necessary for fabricating a p-type ohmic contact electrode. Referring to FIG. 2, ohmic contact electrode 36 comprises a 50 Å layer of palladium (Pd) covered by a 1000 Å layer of gold (Au). Atop the Au layer, a 10 Å layer of titanium (Ti) is deposited. The layers are deposited in a conventional vacuum evaporator. Ti layer, although not required, is particularly useful in improving photoresist adhesion.

Figure 3:
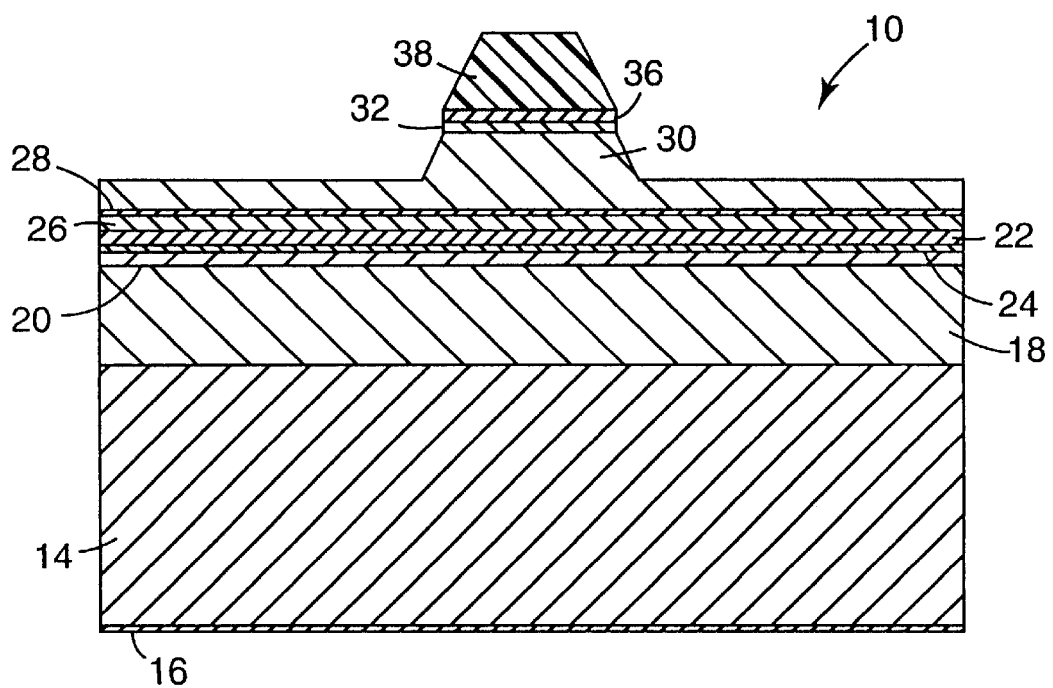
FIG. 3 is a side cross-sectional view of the substrate of FIG. 2 following an etching process.

A mask 38 shown in FIG. 3 is then applied atop the ohmic contact electrode. The size, width and positioning of this mask is dependent upon the final configuration of the heterostructures within the device 10. In one embodiment, Hoechst Celanese photoresist and associated process AZ-5214E is applied and patterned into 4 or 5 $\mu$m lines. The lines are oriented normal to the major flat on AXT™ GaAs wafers (<011>) available from American Crystal Technology located in Dublin Calif.

In one embodiment, the device 10 is then transferred to a vacuum chamber where an ion milling etching process is implemented to form the ridge from device 10. This is used to perform an initial etch through layers 36, 32 into and 30. An Xe$^+$ ion source is used with a beam voltage of 500 volts. Device 10 is rocked ±500 during ion milling and the etch rate is 0.125 $\mu$m/min. The beam from a He-Ne laser is directed through a window in the vacuum chamber and impinged on device 10 during the etching process. The ion beam removes exposed portions of layers 30, 32 and 36 which are not covered by photoresist mask 38. Portions of the laser beam reflected from device 10 are detected and monitored to determine the etch depth. The ion milling process is described in U.S. Pat. No. 5,404,027 which is hereby incorporated by reference.

The etch depth is monitored with the He-Ne laser and is brought to within about 0.5 $\mu$m of layer 28. For the last 2500 Å or more, the ion beam voltage is reduced to 30 volts. At approximately 2000 Å before reaching the etch-stop layer 28, ion milling is stopped. The resulting structure is shown in FIG. 3 and the top of layer 30 is damaged due to the milling process.

Figure 4:
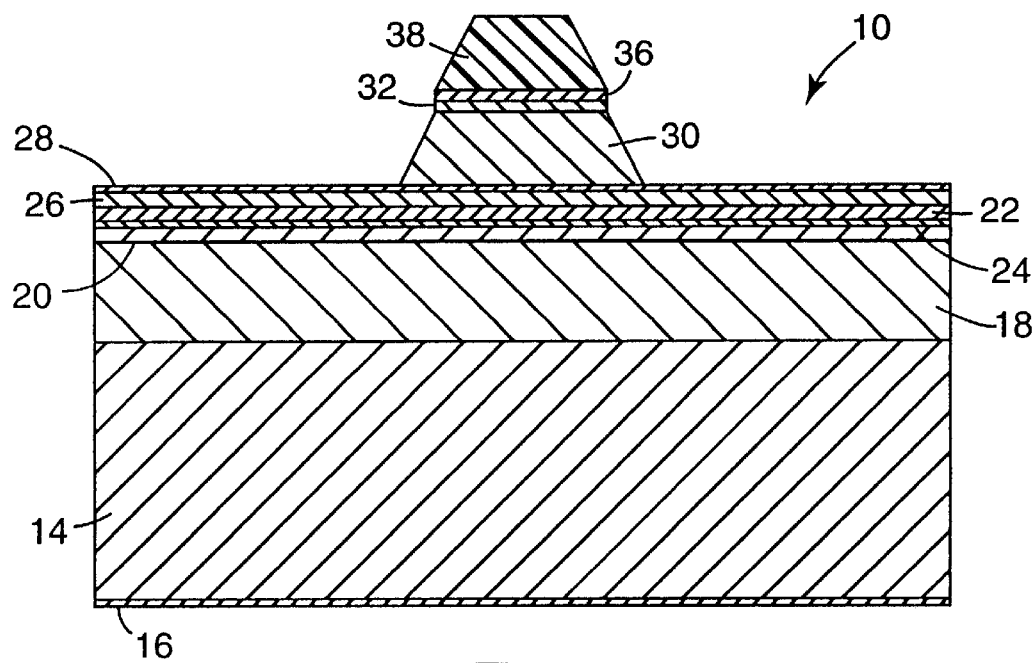
FIG. 4 is a side cross-sectional view of the substrate of FIG. 3 following a subsequent selective chemical etch.

Device 10 is then removed from the vacuum chamber and immediately etched in an aqueous solution of HCl or HBr (concentration is determined by the amount of magnesium present in the etched layer) which selectively etches layer 30. In one embodiment, etching is performed at room temperature without stirring and occurs at a rate of about 1500 Å/sec using "concentrated" HCl solution. Alternatively, the ion milling step may be replaced by other known etching techniques. In other embodiments, the selective chemical etch may be used to remove all of layer 30. Layer 30 is etched until etch-stop layer 28 is reached, at which point selective etching terminates. Device 10 is then removed from etchant solution rinsed and dried. This results in the structure shown in FIG. 4. One aspect of the invention includes the additional etch stop layer 28 spaced apart from waveguide layer 22. This design reduces the number of minority carriers which recombine at the etched surface through dark recombination (i.e., recombination which does not provide luminescence) during operation of the laser diode thereby improving device efficiency. In another embodiment, a separate etch stop layer is not used and waveguide layer 22 acts as an etch stop layer. In either embodiment, waveguide layer 22 is substantially unetched by the HX.

Figure 6:
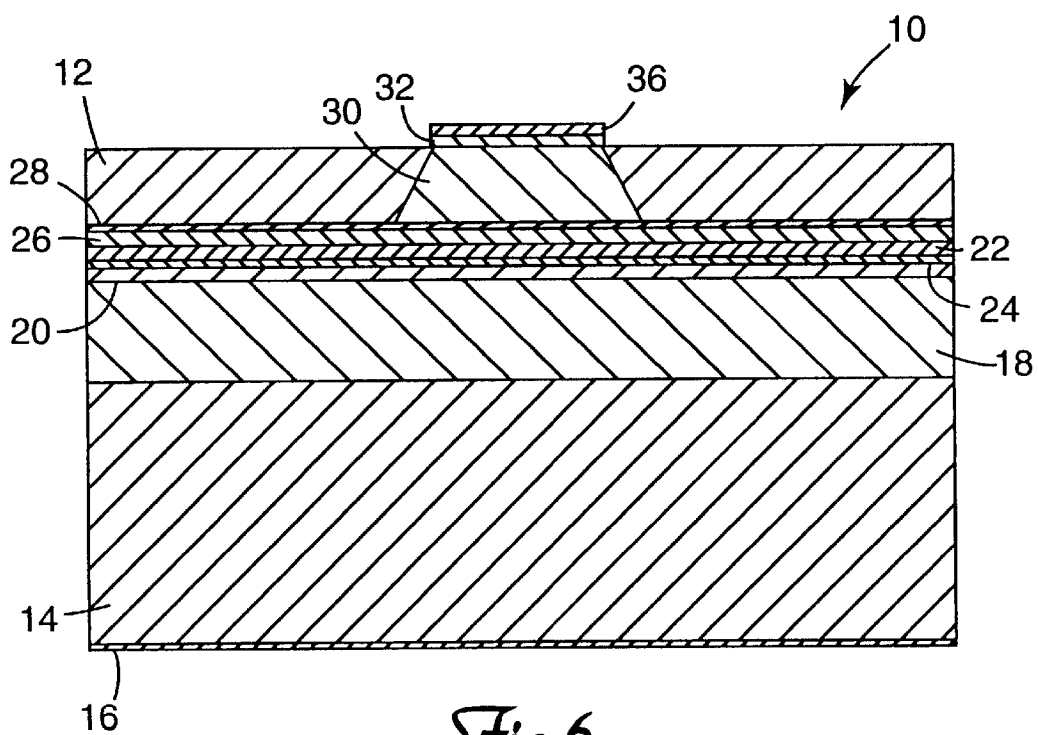
FIG. 6 is a side cross-sectional view of the substrate of FIG. 5 following a lift off process which removes portions of the burying layer.
Figure 5:
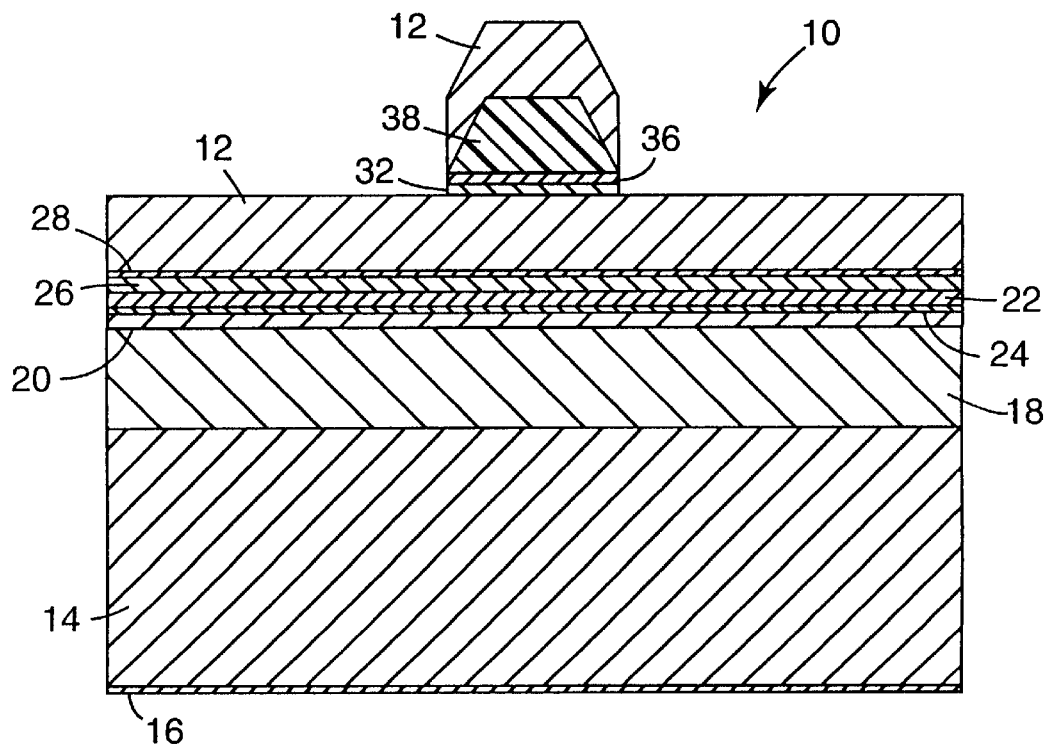
FIG. 5 is a side cross-sectional view of the substrate of FIG. 4 following deposition of a burying layer.

Once the heterostructure is defined by the etching process, burying layer 12 is deposited. Referring to FIG. 5, a 1 $\mu$m layer 12 of polycrystalline ZnS is deposited. Photoresist solvent is applied causing mask layer 38 to "lift off" thereby removing layer 38 along with the portion of layer 12 which overlies layer 38. Ultrasound and acetone may be used to cause the lift off. It may also be desired to ion etch device 10 to partially remove layer 12 and thereby expose a portion of photoresist layer 38 to facilitate lift off. However, this may not be necessary if there is sufficient undercutting from the HX process. This lift-off process exposes layer 36 as shown in FIG. 6.

Referring back to FIG. 1, a bond pad 34 is applied using standard techniques. For example, a 1000 Å layer of Ti followed by a 2000 Å layer of Au is then deposited.

Figure 7A:
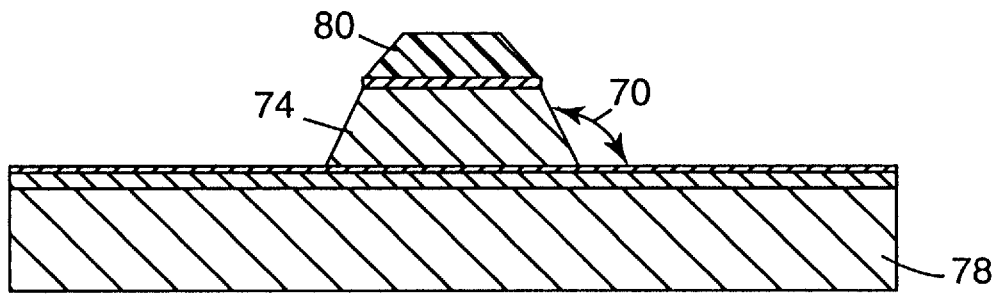
FIG. 7A and 7B are cross-sectional views of substrates which show positive and negative sloped profiles, respectively, made in accordance with the invention.
Figure 7B:
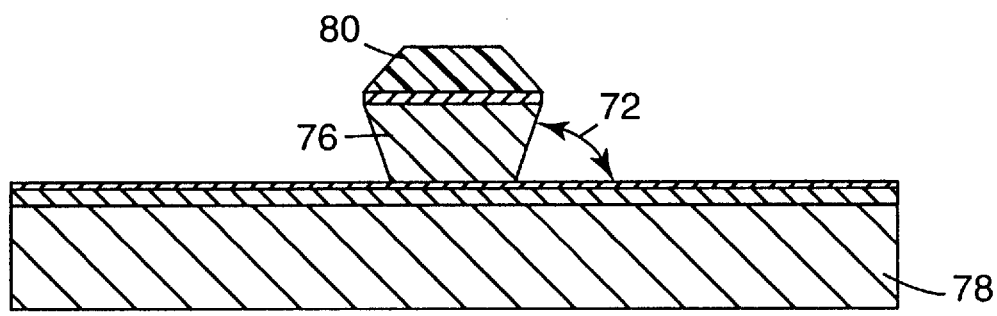

One important aspect of the invention is that the HX will anisotropically etch the side walls of the waveguide ridge. The resulting profile will evolve towards either an obtuse wall angle 70 as shown in FIG. 7A or an acute wall angle 72 as shown in FIG. 7B, depending on the crystallographic orientation of the ridge 74 or 76, respectively carried on substrate 78. The HX etching tends to reveal a slow-etching {111} plane. If ridge 74 is aligned with the <01$\bar{1}$> crystallographic direction (depending on the manufacturer, this is either parallel or perpendicular to the major flat on the wafer), undercutting results in obtuse side-wall angle 70 of about 125°. This geometry is preferred for processes that involve subsequent vacuum deposition of a burying layer. On the other hand, if ridge 76 is aligned parallel to the <011> direction, undercutting results in an acute side-wall angle 72 of about 55°. This may be preferred for some applications. Advantageously, p-type contact 80 is larger than the active region which provides a lower series resistance for a given active area.

The particular etch rate of the selective etch may be adjusted by controlling the concentration of Mg in the layer to be etched or by controlling the concentration of the HX solution. Concentrations of aqueous HX solutions useful in the invention can be in the range of 0.1N to concentrated (saturated) solution. Preferably, HCl concentrations range from 1N to 12N, more preferably from 5N to 12N, even more preferably from 10N to 12N and most preferably 12N (i.e., "concentrated HCl"). Preferably, HBr concentrations range from 1N to 8N, more preferably from 6N to 8N, and more preferably 8N (i.e., "concentrated HBr"). Mg concentration may be determined by observing the bandgap of the material which, in one embodiment, is 2.85 eV, about 8%. In other embodiments, the layer that is etched by HX is, for example, MgZnSSe, MgZnSe, BeMgZnSe, or BeMgZnSSe.

The present invention offers advantages over the art in that it provides a useful photolithographic process and apparatus to form desired shapes in II–VI semiconductor material. The invention is useful with any II–VI device and is not limited to the laser diode set forth herein. For example, it is useful in the fabrication of II–VI heterojunction bipolar transistors to enable contact to the base. Further, the invention includes the resultant structure formed by the aforementioned etching process, including those devices which contain an etch stop layer following the fabrication process.

Those skilled in the art will recognize that any appropriate etch stop layer may be used which etches at a rate which is less than the etch rate of the material to be removed, including a layer with a lower relative concentration of Mg. Generally, the etch stop should be selected such that it is compatible with the process or finished product. It will also be understood that the etch stop layer may be removed using any appropriate technique prior to completion of the fabrication process.

Although the present invention has been described with reference to preferred embodiments, workers skilled in the art will recognize that changes may be made in form and detail without departing from the spirit and scope of the invention.

What is claimed is:

1. A method of fabricating a II–VI compound semiconductor device comprising the steps:

providing a first layer of II–VI semiconductor;

providing a second layer of II–VI semiconductor adjacent to the first layer, wherein the second layer includes magnesium (Mg) and a Mg content of the second layer is greater than a Mg content of the first layer;

providing a mask proximate the second layer; selectively etching unmasked portions of said second layer with an aqueous solution that includes HX, wherein X is either chlorine or bromine; and wherein the second layer is partially ion beam etched prior to said step of selectively etching.

2. The method of claim 1 wherein the first layer has a thickness of more than about 50 Å.

3. The method of claim 1 wherein the second layer is partially reactive ion etched prior to said step of selectively etching.

4. The method of claim 1 wherein the second layer is partially chemically etched prior to said step of selectively etching.

5. The method of claim 1 wherein the second layer comprises MgZnSSe.

6. The method of claim 1 wherein the second layer comprises BeMgZnSe.

7. The method of claim 1 wherein the second layer comprises MgZnSe.

8. The method of claim 1 wherein the second layer comprises BeMgZnSSe.

9. The method of claim 1 including providing additional layers to form a II–VI laser diode.

10. The method of claim 9 wherein the second layer comprises a cladding layer of the laser diode.

11. The method of claim 9 wherein the first layer comprises a guiding layer of the laser diode.

12. The method of claim 1 including depositing a third layer upon the mask and subsequently lifting off a portion of the third layer by removing the mask.

13. The method of claim 1 wherein the mask comprises photoresist.

14. The method of claim 1 including providing an angle to a sidewall of the second layer by selectively aligning the mask with a crystal orientation of the second layer.

15. The method of claim 14 wherein the angle is about 55°.

16. The method of claim 14 wherein the angle is about 125°.

17. A method of fabricating a II–VI compound semiconductor device comprising the steps:

providing a first layer of II–VI semiconductor;

providing a second layer of II–VI semiconductor adjacent to the first layer, wherein the second layer includes magnesium (Mg) and a Mg content of the second layer is greater than a Mg content of the first layer;

providing a mask proximate the second layer;

selectively etching unmasked portions of said second layer with an aqueous solution that includes HX, wherein X is either chlorine or bromine; and wherein the second layer comprises BeMgZnSe.

18. The method of claim 17 wherein the second layer is partially ion beam etched prior to said step of selectively etching.

19. The method of claim 18 wherein the second layer is partially chemically etched prior to said step of selectively etching.

20. The method of claim 18 including providing additional layers to form a II–VI laser diode.

21. The method of claim 20 wherein the second layer comprises a cladding layer of the laser diode.

22. The method of claim 20 wherein the first layer comprises a guiding layer of the laser diode.

23. The method of claim 18 including depositing a third layer upon the mask and subsequently lifting off a portion of the third layer by removing the mask.

24. The method of claim 18 wherein the mask comprises photoresist.

25. The method of claim 18 including providing an angle to a sidewall of the second layer by selectively aligning the mask with a crystal orientation of the second layer.

26. The method of claim 25 wherein the angle is about 55°.

27. The method of claim 25 wherein the angle is about 125°.

28. The method of claim 17 wherein the second layer is partially reactive ion etched prior to said step of selectively etching.

29. The method of claim 18 wherein the first layer has a thickness of more than about 50ÅA.

30. A method of fabricating a II–VI compound semiconductor device comprising the steps:
providing a first layer of II–VI semiconductor;
providing a second layer of II–VI semiconductor adjacent to the first layer, wherein the second layer includes magnesium (Mg) and a Mg content of the second layer is greater than a Mg content of the first layer;
providing a mask proximate the second layer;
selectively etching unmasked portions of said second layer with an aqueous solution that includes HX, wherein X is either chlorine or bromine; and
wherein the second layer comprises MgZnSe.

31. The method of claim 30 wherein the second layer is partially ion beam etched prior to said step of selectively etching.

32. The method of claim 31 wherein the second layer is partially reactive ion etched prior to said step of selectively etching.

33. The method of claim 31 wherein the second layer is partially chemically etched prior to said step of selectively etching.

34. The method of claim 30 including providing additional layers to form a II–VI laser diode.

35. The method of claim 34 wherein the second layer comprises a cladding layer of the laser diode.

36. The method of claim 34 wherein the first layer comprises a guiding layer of the laser diode.

37. The method of claim 30 including depositing a third layer upon the mask and subsequently lifting off a portion of the third layer by removing the mask.

38. The method of claim 26 wherein the mask comprises photoresist.

39. The method of claim 26 including providing an angle to a sidewall of the second layer/by selectively aligning the mask with a crystal orientation of the second layer.

40. The method of claim 39 wherein the angle is about 55°.

41. The method of claim 39 wherein the angle is about 125°.

42. The method of claim 30 wherein the first layer has a thickness of more than about 50Å.

43. A method of fabricating a II–VI compound semiconductor device comprising the steps:
providing a first layer of II–VI semiconductor;
providing a second layer of II–VI semiconductor adjacent to the first layer, wherein the second layer includes magnesium (Mg) and a Mg content of the second layer is greater than a Mg content of the first layer;
providing a mask proximate the second layer;
selectively etching unmasked portions of said second layer with an aqueous solution that includes HX, wherein X is either chlorine or bromine; and
wherein the second layer comprises BeMgZnSSe.

44. The method of claim 43 wherein the second layer is partially ion, beam etched prior to said step of selectively etching.

45. The method of claim 44 wherein the second layer is partially reactive ion etched prior to said step of selectively etching.

46. The method of claim 44 wherein the second layer is partially chemically etched prior to said step of selectively etching.

47. The method of claim 43 including providing additional layers to form a II–VI laser diode.

48. The method of claim 47 wherein the second layer comprises a cladding layer of the laser diode.

49. The method of claim 47 wherein the first layer comprises a guiding layer of the laser diode.

50. The method of claim 43 including depositing a third layer upon the mask and subsequently lifting off a portion of the third layer by removing the mask.

51. The method of claim 43 wherein the mask comprises photoresist.

52. The method of claim 43 including providing an angle to a sidewall of the second layer by selectively aligning the mask with a crystal orientation of the second layer.

53. The method of claim 52 wherein the angle is about 55°.

54. The method of claim 52 wherein the angle is about 125°.

55. The method of claim 43 wherein the first layer has a thickness of more than about 50Å.

56. A method of fabricating a II–VI compound semiconductor device comprising the steps:
providing a first layer of II–VI semiconductor; -providing a second layer of II–VI semiconductor adjacent to the first layer, wherein the second layer includes magnesium (Mg) and a Mg content of the second layer is greater than a Mg content of the first layer;
providing a mask proximate the second layer;
depositing a third layer upon the mask and subsequently lifting off a portion of the third layer by removing the mask; and
selectively etching unmasked portions of said second layer with an aqueous solution that includes HX, wherein X is either chlorine or bromine.

57. The method of claim 56 wherein the second layer is partially ion beam etched prior to said step of selectively etching.

58. The method of claim 57 wherein the second layer is partially reactive ion etched prior to said step of selectively etching.

59. The method of claim 57 wherein the second layer is partially chemically etched prior to said step of selectively etching.

60. The method of claim 57 wherein the second layer comprises MgZnSSe.

61. The method of claim 56 wherein the second layer comprises BeMgZnSe.

62. The method of claim 56 wherein the second layer comprises MgZnSe.

63. The method of claim 56 wherein the second layer comprises BeMgZnSSe.

64. The method of claim 56 including providing additional layers to form a II–VI laser diode.

65. The method of claim 64 wherein the second layer comprises a cladding layer of the laser diode.

66. The method of claim 64 wherein the first layer comprises a guiding layer of the laser diode.

67. The method of claim 56 wherein the mask comprises photoresist.

68. The method of claim 56 including providing an angle to a sidewall of the second layer by selectively aligning the mask with a crystal orientation of the second layer.

69. The method of claim 68 wherein the angle is about 55°.

70. The method of claim 68 wherein the angle is about 125°.

71. The method of claim 56 wherein the first layer has a thickness of more than about 50Å.

72. A method of fabricating a II–VI compound semiconductor device comprising the steps:

providing a first layer of II–VI semiconductor;

providing a second layer of II–VI semiconductor adjacent to the first layer, wherein the second layer includes magnesium (Mg) and a Mg content of the second layer is greater than a Mg content of the first layer;

providing a mask proximate the second layer;

selectively etching unmasked portions of said second layer with an aqueous solution that includes HX, wherein X is either chlorine or bromine; and wherein the mask comprises photoresist.

73. The method of claim 72 wherein the second layer is partially ion beam etched prior to said step of selectively etching.

74. The method of claim 73 wherein the second layer is partially reactive ion etched prior to said step of selectively etching.

75. The method of claim 73 wherein the second layer is partially chemically etched prior to said step of selectively etching.

76. The method of claim 72 wherein the second layer comprises MgZnSSe.

77. The method of claim 72 wherein the second layer comprises BeMgZnSe.

78. The method of claim 72 wherein the second layer comprises MgZnSe.

79. The method of claim 72 wherein the second layer comprises BeMgZnSSe.

80. The method of claim 72 including providing additional layers to form a II–VI laser diode.

81. The method of claim 80 wherein the second layer comprises a cladding layer of the laser diode.

82. The method of claim 80 wherein the first layer comprises a guiding layer of the laser diode.

83. The method of claim 72 including depositing a third layer upon the mask and subsequently lifting off a portion of the third layer by removing the mask.

84. The method of claim 72 including providing an angle to a sidewall of the second layer by selectively aligning the mask with a crystal orientation of the second layer.

85. The method of claim 84 wherein the angle is about 55°.

86. The method of claim 84 wherein the angle is about 125°.

87. The method of claim 72 wherein the first layer has a thickness of more than about 50Å.

88. A method of fabricating a II–VI compound semiconductor device comprising the steps:

providing a first layer of II–VI semiconductor;

providing a second layer of II–VI semiconductor adjacent to the first layer, wherein the second layer includes magnesium (Mg) and a Mg content of the second layer is greater than a Mg content of the first layer;

providing a mask proximate the second layer;

selectively etching unmasked portions of said second layer with an aqueous solution that includes HX, wherein X is either chlorine or bromine; and providing an angle to a sidewall of the second layer by selectively aligning the mask with a crystal orientation of the second layer, wherein the angle is about 55°.

89. The method of claim 88 wherein the second layer is partially ion beam etched prior to said step of selectively etching.

90. The method off claim 89 wherein the second layer is partially reactive ion etched prior to said step of selectively etching.

91. The method of claim 89 wherein the second layer is partially chemically etched prior to said step of selectively etching.

92. The method of claim 88 wherein the second layer comprises MgZnSSe.

93. The method of claim 88 wherein the second layer comprises BeMgZnSe.

94. The method of claim 88 wherein the second layer comprises MgZnSe.

95. The method of claim 88 wherein the second layer comprises BeMgZnSSe.

96. The method of claim 88 including providing .additional layers to form a II–VI laser diode.

97. The method of claim 96 wherein the second layer comprises a cladding layer of the laser diode.

98. The method of claim 96 wherein the first layer comprises a guiding layer of the laser diode.

99. The method of claim 88 including depositing a third layer upon the mask and subsequently lifting off a portion of the third layer by removing the mask.

100. The method of claim 88 wherein the mask comprises photoresist.

101. The method of claim 88 wherein the first layer has a thickness of more than about 50Å.

102. A method of fabricating a II–VI compound semiconductor device comprising the steps:

providing a first layer of II–VI semiconductor;

providing a second layer of II–VI semiconductor adjacent to the first layer, wherein the second layer includes magnesium (Mg) and a Mg content of the second layer is greater than a Mg content of the first layer;

providing a mask proximate the second layer;

selectively etching unmasked portions of said second layer with an aqueous solution that includes HX, wherein X is either chlorine or bromine; and providing an angle to a sidewall of the second layer by selectively aligning the mask with a crystal orientation of the second layer, wherein the angle is about 125°.

103. The method of claim 102 wherein the second layer is partially ion beam etched prior to said step of selectively etching.

104. The method of claim 103 wherein the second layer is partially reactive ion etched prior to said step of selectively etching.

105. The method of claim 103 wherein the second layer is partially chemically etched prior to said step of selectively etching.

106. The method of claim 102 wherein the second layer comprises MgZnSSe.

107. The method of claim 102 wherein the second layer comprises BeMgZnSe.

108. The method of claim 102 wherein the second layer comprises MgZnSe.

109. The method of claim 102 wherein the second layer comprises BeMgZnSSe.

110. The method of claim 102 including providing additional layers to form a II–VI laser diode.

111. The method of claim 110 wherein the second layer comprises a cladding layer of the laser diode.

112. The method of claim 110 wherein the first layer comprises a guiding layer of the laser diode.

113. The method of claim 102 including depositing a third layer on the mask and subsequently lifting off a portion of the third layer by removing the mask.

114. The method of claim 102 wherein the mask comprises photoresist.

115. The method of claim 102 wherein the first layer has a thickness of more than about 50Å.

* * * * *

UNITED STATES PATENT AND TRADEMARK OFFICE
CERTIFICATE OF CORRECTION

PATENT NO.: 5,834,330

DATED: November 10, 1998

INVENTOR(S): Michael A. Haase, Paul F. Baude, and Thomas J. Miller

It is certified that error appears in the above-identified patent and that said Letters Patent is hereby corrected as shown below:

Title page, and column 1, line 1.
      "SELECTIVE ETCH METHOD FOR II-VI SEMICONDUCTORS"
        should read - - SELECTIVE ETCH FOR II-VI SEMICONDUCTORS - -

Col. 4, line 22, "±500" should read - - ±50° --.

Col. 7, In claim 29, "50ÅA" should read - - 50Å - - .

Col. 7, In claim 38, "26" should read - - 30 - - .

Col. 7, In claim 39, "26" should read - - 30 - - .

Col. 10, In claim 90, "off" should read - - of - - .

Signed and Sealed this

Eleventh Day of April, 2000

Attest:

Q. TODD DICKINSON

Attesting Officer

Director of Patents and Trademarks